United States Patent [19]

Eckels et al.

[11] 4,392,248

[45] Jul. 5, 1983

[54] ATTENTION SIGNAL RECEIVER FOR EMERGENCY BROADCAST SYSTEMS

[75] Inventors: Calvin Eckels, San Jose; John James, Los Gatos, both of Calif.

[73] Assignee: Time and Frequency Technology, Inc., Santa Clara, Calif.

[21] Appl. No.: 308,611

[22] Filed: Oct. 5, 1981

[51] Int. Cl.$^3$ .......................... H04B 1/26; H03J 7/20

[52] U.S. Cl. .......................................... 455/161; 455/36; 455/228

[58] Field of Search ........................ 455/31, 32, 35, 36, 455/161, 166, 169, 221, 227, 228, 62

[56] References Cited

U.S. PATENT DOCUMENTS

| | | | |
|---|---|---|---|
| 3,201,696 | 8/1965 | Sharp | 325/343 |
| 3,426,279 | 2/1969 | Berman | 455/32 |
| 3,470,481 | 9/1969 | Myers et al. | 325/470 |
| 3,482,166 | 12/1969 | Gleason | 325/341 |
| 3,497,813 | 8/1967 | Gallagher | 325/456 |
| 3,617,895 | 11/1971 | Tomsa et al. | 325/453 |
| 3,619,788 | 11/1971 | Giles, Jr. et al. | 325/456 |
| 3,623,106 | 11/1971 | Zerega, Jr. | 343/206 |
| 3,654,555 | 4/1972 | Ryan et al. | 325/348 |
| 3,750,032 | 7/1973 | Andrews | 325/470 |
| 3,840,811 | 10/1974 | Blouch | 455/32 |
| 4,009,442 | 2/1977 | Von Brömssen | 455/166 |
| 4,013,958 | 3/1977 | Spayth | 455/32 |
| 4,069,454 | 1/1978 | Winkelmann | 455/32 |
| 4,103,235 | 7/1978 | Bryant | 325/64 |

OTHER PUBLICATIONS

Bryant Electronics Decoder.
TFT EBS 760.
EBS Decoder Audio Services, Inc.

*Primary Examiner*—Marc E. Bookbinder
*Attorney, Agent, or Firm*—Jack M. Wiseman; Francis W. Anderson

[57] ABSTRACT

An attention signal receiver in which emergency broadcast transmissions are detected from various locations. A scanning circuit sequentially activates means to produce a plurality of oscillating frequencies which mix or beat with the incoming r.f. signals. An attention signal is a two tone signal that includes both a 960 $H_z$ frequency signal and a 853 $H_z$ frequency signal. The audio stage of the receiver is connected to a two tone decoder that passes only a 960 $H_z$ signal and a 853 $H_z$ signal. A squelch circuit is also connected to the audio stage of the receiver. Connected to the output of the tone decoder is a one second time delay circuit and a ten second time delay circuit. If an attention signal is detected for a period of time in excess of 1 second, the one second time delay circuit stops the scanning of the scanning circuit to lock in the receiver to the first carrier detected with an attention signal. The ten second time delay circuit normally disables the squelching circuit. If the detected attention signal continues for a period of time in excess of 10 seconds, the ten second time delay circuit enables the squelch circuit to operate an alarm.

12 Claims, 4 Drawing Figures

ATTENTION SIGNAL RECEIVER FOR EMERGENCY BROADCAST SYSTEMS

BACKGROUND OF THE INVENTION

The present invention relates in general to apparatus for use in emergency broadcast signal reception, and more particularly to an attention signal receiver for an emergency boradcast systems.

Generally, an emergency broadcast system includes a plurality of radio frequency transmitters originating at various locations. Some transmitters transmit amplitude modulated frequencies at standard broadcast wavelengths. Other transmitters transmit frequency modulated signals at standard broadcast wavelengths. The AM broadcast stations transmit the carrier amplitude modulated at 960 cycles and at 853 cycles. Similarly, FM broadcast stations transmit the carrier frequency modulated at 960 cycles and at 853 cycles.

Multiple scanning techniques are essential in the event one transmitter is idle. When such an event occurs, it is necessary to be able to receive the transmission from another or more distant transmitter. When an attention signal is detected, however, it is desirable to lock-in the first detected attention signal and to lock out the other attention signals.

The EBS System, Model 760, manufactured by Time and Frequency Technology, Inc. of Santa Clara, Calif., receives an emergency two-tone attention signal from an AM or FM station being monitored dependent on the type of receiver. The emergency two-tone signal is heard on an EBS System speaker after such a tone has been received for at least 8 seconds. The speaker is demuted after 8 seconds allowing the two-tone signal to be heard and a relay is energized to actuate an external alarm. The simultaneously generated two-tone signals are 853 $H_z$ and 960 $H_z$. In another version of the EBS System, the detection of 1 $KH_z$ tone for a period of time greater than 10 seconds through a ten second time delay circuit operates an alarm. An audio squelch circuit in a two-tone encoder/decoder operates to energize or excite an alarm. The EBS System, Model 760, can be either an AM Receiver or an FM Receiver. A timing circuit of a ten second time delay is a signal averaging integrator which eliminates false turn-on by noise signals.

An EBS decoder manufactured by Audio Services, Inc. of Detroit, Mich. and other manufacturers detects two-tone EBS alert signals and can be used with standard AM or standard FM broadcast receivers. Upon receipt of two simultaneously transmitted tones via the receiver, the EBS decoder monitors the signal silently for ten seconds to guard against false triggering. It then automatically demutes the speaker for aural monitoring and an external alarm is activated. The two-tone alert signals are 853 $H_z$ and 960 $H_z$.

In the patent to Myers et al., No. 3,470,481, issued on Sept. 30, 1979, for Multichannel Communication Receiver With Automatic Sampling And Lock In One Channel, there is disclosed a receiver in which several incoming frequencies from differently located transmitters are alternately detected. A plurality of local oscillators of different frequencies are alternately excited for sequential scanning of incoming carrier frequencies by a sequential scanning circuit. As soon as an attention signal is detected from one of the transmitters, a disabling signal is applied to the sequential scanning circuit for locking the receiver to the transmission from the transmitter whose attention signal was first detected.

In the U.S. Patent to Gleason, No. 3,482,166, issued on Dec. 2, 1969, for Multi-Frequency Receiver With Automatic Monitoring Of Channels With One Channel Priority, there is disclosed a superheterodyne receiver for receiving the transmission from a plurality of transmitters. A plurality of local oscillators are alternately operated for mixing with incoming carrier frequencies. A squelch circuit mutes the audio output until an attention signal is received. After the attention signal is detected, the squelch circuit demutes the audio output and disables the oscillator switching circuit to lock the receiver to the channel of the transmitter of the attention signal.

The U.S. Patent to Zerega, Jr., No. 3,623,106, issued on Nov. 23, 1971, for Multifrequency Receiver Employing Tone-Coded Squelch With Automatic Channel Selection discloses a multichannel receiver in which a plurality of local oscillators are alternately excited by a sequencing circuit. When an attention signal is detected, a fast squelching circuit of a relatively short time delay disables the sequencing circuit. This locks or latches the receiver to the carrier detected with the attention signal. If the latched carrier is of sufficient duration for a tone operated squelching circuit to operate, then the tone operated squelching circuit will disable the sequencing circuit. The time delay for the time operated squelching circuit is relatively long.

The U.S. Patent to Giles, Jr. et. al., No. 3,169,788, issued on Nov. 9, 1971, for a Circuit For Giving Priority To One Of A Plurality Of Automatically Monitored Channels In A Receiver discloses a superheteodyne receiver in which a plurality of oscillators are sequentially operated by a sequential scanning switch. When a signal is received, a noise squelch disables the sequential scanning switch to lock the receiver to the channel in which the signal is present.

As for the U.S. Patent to Tomsa et al., No. 3,617,895, issued on Nov. 2, 1971, for Multifrequency Receiver With Automatic Channel Selection And Priority Channel Monitoring, it discloses a receiver with a plurality of local oscillators operated in sequence by a switching circuit. When a signal is detected, a squelching circuit latches the switching system so that the receiver is held to the carrier having the signal.

The U.S. Patent to Bryant, No. 4,103,235, issued on July 25, 1978, for Two-Tone Attention Signal Broadcasting System discloses a receiver-decoder for emergency broadcast systems. The decoder receives an audio signal and filters out the two tones of an attention signal. When the two tone attention signal is received, the speaker of the receiver is demuted for an announcement. A timer is provided to reset the decoder after a predetermined time interval.

SUMMARY OF THE INVENTION

An attention signal receiver in which oscillator means are sequentially operated by a scanning circuit to produce a plurality of oscillating frequencies. When an attention signal is detected for a time period in excess of a first predetermined time delay, the scanning circuit is stopped to lock-in the receiver to the carrier in which the attention signal is present. When the attention signal remains for a second predetermined period of time, which is greater than said first predetermined period of time, a circuit is enabled to operate an alarm or speaker.

By virtue of the present invention, an emergency broadcast receiver is capable of scanning a multiple of radio frequency carriers from variously located radio transmitters. If a primary broadcast transmitter is not operational, then there is an option to lock in a secondary radio transmitter.

An attention signal receiver in which oscillator means are sequentially operated by a scanning circuit to produce a plurality of oscillating frequencies. When an attention signal is detected, the scanning circuit is stopped to lock-in the receiver to the carrier in which the attention signal is present.

Another feature of the present invention is that the receiver embodying the present invention operates to produce an attention signal from the emergency broadcast transmitter that is first detected by the receiver. All succeeding transmissions of attention signals from the other emergency broadcast transmitters are locked out and it is only the first detected emergency broadcast transmission that is locked in by the receiver.

Another feature of the present invention is the use of attention signals to have the capability of operating an external alarm device and a flasher.

DESCRIPTION OF THE PREFERRED EMBODIMENT

Figure 1:
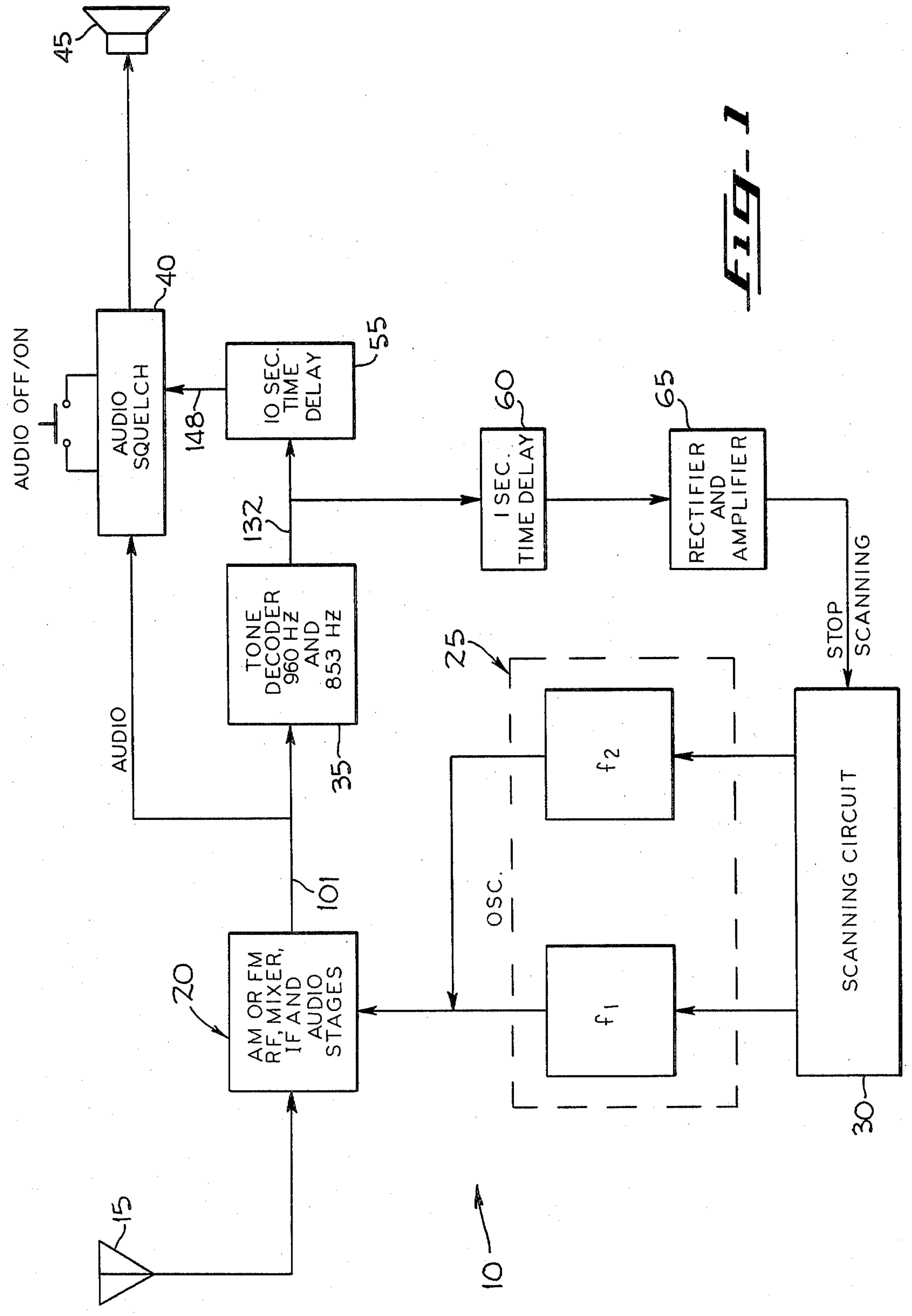
FIG. 1 is a block diagram of a radio frequency receiver embodying the present invention.

Illustrated in FIG. 1 is an attention signal receiver 10 embodying the present invention, which comprises a suitable antenna 15 for detecting radio frequency signals. The radio signals picked up by the antenna 15 are applied to the r.f. stage of conventional and well-known radio frequency receiver stages 20. The radio frequency receiver stages 20 may be either for an AM or FM radio frequency reception. The stages thereof may be of the type that are well-known and conventional in either home radio FM and or home radio AM receivers. In the exemplary embodiment, well-known conventional stages for an FM radio receiver are illustrated. Such typical receiver stages 20 includes an RF stage, mixer stage, IF stage, audio detector stage and an audio amplifier stage.

The output of the radio frequency stages 20 is an audio frequency signal. In the exemplary embodiment, attention signals employed in the emergency broadcast systems are two-tone attention signals that have a 853 $H_z$ frequency signal and 960 $H_z$ frequency signal.

The output of the RF stage is applied to a mixer demodulator, discriminator or the like of the radio frequency radio stages 20 to produce an IF frequency. Local oscillator means 25 or beat frequency oscillator means of the type used in radio frequency superheteodyne receivers produce oscillating frequencies that are sequentially and continuously applied to the mixer, demodulator, discriminator or the like stage to produce an IF frequency signal. Each oscillating frequency of the oscillators means 25 is different. Each oscillating frequency is intended to mix or beat against a preselected radio frequency carrier for a predetermined radio broadcasting station to produce the IF frequency. The radio broadcasting stations are located in different locations. This, oscillating frequency f1 is intended to beat or mix against a carrier transmitted by a radio broadcasting station A located in area X and oscillating frequency f2 is intended to beat or mix against a carrier transmitted by a radio station B located in area Y.

For sequentially and continuously operating the oscillators means 25 for producing a plurality of oscillating frequencies, a suitable scanning circuit 30 is employed. Thus, the attention signal receiver 10 sequentially and continuously receives radio frequency transmissions from a plurality of radio frequency transmitters variously located.

The IF frequency signal is detected or demodulated to produce audio signals. If an attention signal is present, the audio signals, in the exemplary embodiment, will be a two tone attention signal that includes a 960 $H_z$ signal and a 853 $H_z$ signal. Connected to the output of the audio stage of the radio frequency receiver stages 20 is a two tone decoder 35 and a well-known audio squelch circuit 40. Connected to the output of the audio squelch circuit 40 is an alarm or speaker. A suitable power supply or adapter may be connected to the terminal 50 for supplying power to the receiver 10 (FIG. 3B). A suitable source of power, such as battery 51, supplies a suitable voltage for the receiver 10.

Normally, the audio squelch circuit 40 is disabled by a ten second time delay circuit 55. Therefore, the audio squelch circuit 40 does not normally operate to activate the speaker or alarm 45.

Also connected to the output of the audio stage of the radio frequency receiver stages 20 is the two tone decoder 35 which includes tone filters to pass, in the exemplary embodiment, only a 950 $H_z$ frequency signal and a 853 $H_z$ frequency signal.

Connected to the output of the two tone decoder 35 is a one second time delay circuit 60. Should an attention signal, such as a 960 $H_z$ signal and a 853 $H_z$ signal, be present in the output of the tone decoder 35 for a period of time in excess of one second, the one second time delay circuit by way of a rectifier and amplifier circuit 65 will stop the operation of the scanning circuit to lock the radio frequency receiver stages 20 to the first carrier transmitting an attention signal. Should the attention signal present in the output of the two tone decoder 35 continue for a period of time in excess of 10 seconds, then the ten second time delay circuit will enable the audio squelch circuit 40 to operate. Thereupon, the audio squelch circuit 40 operates to excite the alarm 45 or demute the speaker. The alarm 45 is in the form of a speaker. When demuted by the squelch circuit 40, the alarm 45 operates and produces the dual tone sound of the attention signal.

It is apparent that the one second time delay and the ten second time delay are only by way of example and that other periods of time may be employed.

Figure 2:
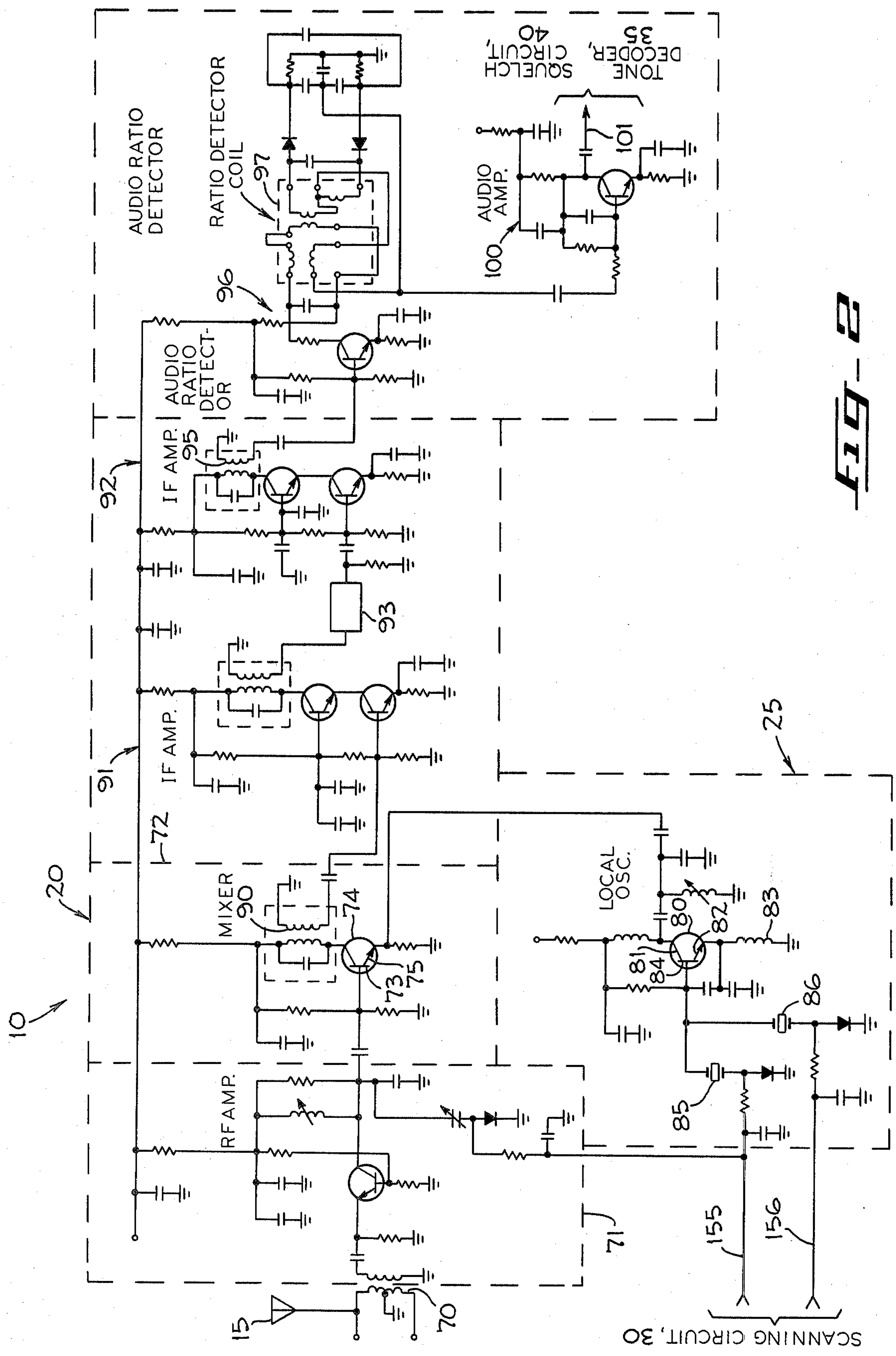
FIG. 2 is a schematic diagram of the r.f. stage, mixer stage, IF stage, local oscillator stage and the audio stage of the receiver shown in FIG. 1.

As shown in FIG. 2, the antenna 15 is coupled through a suitable transformer 70 to a conventional radio frequency amplifier 71 of the radio frequency receiver stages 20. The output of the radio frequency amplifier 71 is connected to the input of a conventional mixer 72 of the radio frequency receiver stages 20. The amplified radio frequency signals in the output of the radio frequency amplifier 72 is applied to the base electrode 73 of a transistor 74. Connected to an emitter electrode 75 of the transistor 74 is the output of the oscillator means 25.

In the exemplary embodiment, the oscillator means 25 comprises a single amplifier represented by a transistor 80. It is the collector 81 of the transistor 80 that is connected to the emitter of the mixer transistor 75. An emitter electrode 82 of the oscillator amplifier transistor 80 is connected to ground through a suitable inductance 83. Connected to a base electrode 84 of the oscillator amplifier transistor 80 are a plurality of well-known crystals 85 and 86. Although a single amplifier transistor 80 is employed, the oscillator means 25 through the respective crystals 85 and 86 provide, in effect, two crystal oscillators.

The oscillating frequencies of the two crystal oscillators are preselected by the resonating frequencies of the crystals 85 and 86. Each oscillating frequency, in the exemplary embodiment, is 10.7 megahertz above the predetermined incoming carrier frequency of the associated radio broadcast station selected for emergency broadcast system. If one broadcast transmitter transmits at a 100 megahertz frequency, then one oscillator oscillates at 110.7 megahertz. If another broadcast transmitter transmits at a 90 megahertz frequency, then the other oscillator oscillates at 100.7 megahertz. While only two oscillating circuits are shown for two radio broadcast stations located in different vicinities, it is apparent that a greater number of oscillators can be employed for detecting the carriers of a greater number of broadcast stations. The oscillators are sequentially and continuously operated by the scanning circuit 30.

A transformer 90 in the output of the mixer 72 is coupled to conventional IF amplifiers 91 and 92, which are connected in cascade. The IF frequency applied to the IF amplifiers 91 and 92, in the exemplary embodiment, is 10.7 megahertz. Interposed between the IF amplifier 91 and the amplifier 92 is a suitable ceramic filter 93 for passing only the IF frequency of 10.7 megahertz.

Connected to the output of the IF amplifier 92 through a suitable transformer 95 is a conventional discriminator circuit 96 in the form of an audio ratio detector. The audio ratio detector 96 discriminates either the low frequencies or the high frequencies of the selected audio frequency band. Toward this end, the audio ratio detector 96 includes a well-known ratio detector coil 97 of the type known as the JW MILLER #8849 ratio detector coil. The output of the audio ratio detector 97 is fed to a conventional audio amplifier 100.

The output of the audio amplifier 100 is applied to the audio squelch circuit 40 (FIG. 3B) and the two tone decoder 35 (FIG. 3A) over a conductor 101. The audio squelch circuit 40 comprises a suitable audio amplifier 102 (FIG. 3B). Connected to the output of the amplifier 103 are power transistors 104 and 105. Incoming audio signals from the amplifier 102 are applied to the base electrodes of power transistors 104 and 105. The emitters of the power transistors 104 and 105 are connected in common to the alarm 45.

Also included in the audio squelch circuit 40 is a squelching transistor 110. When the collector electrode of the squelching transistor 110 is at a low voltage, for example is at a zero volt output, the audio amplifier 102 is at a low output voltage. As a consequence thereof, the power transistors 104 and 105 are off or non-conducting and the alarm 45 is not operating. When the collector electrode of the squelching transistor 110 is at a high voltage, for example at a positive 9 volts, the audio amplifier 102 is at a high output voltage. As a result thereof, the power transistors 104 and 105 are turned on and the alarm 45 operates. Normally, the output voltage of the squelching transistor 110 is low and the alarm 40 is not operating. It is the ten second time delay circuit 55 that controls the operation of the squelching transistor 110 to normally maintain the alarm 45 in an off state. Stated otherwise, when the squelching transistor 110 is non-conducting, the speaker 45 is muted. When the squelching transistor 110 is conducting the speaker 45 is demuted for producing the two tone attention alert signal or sound.

Figure 3A:
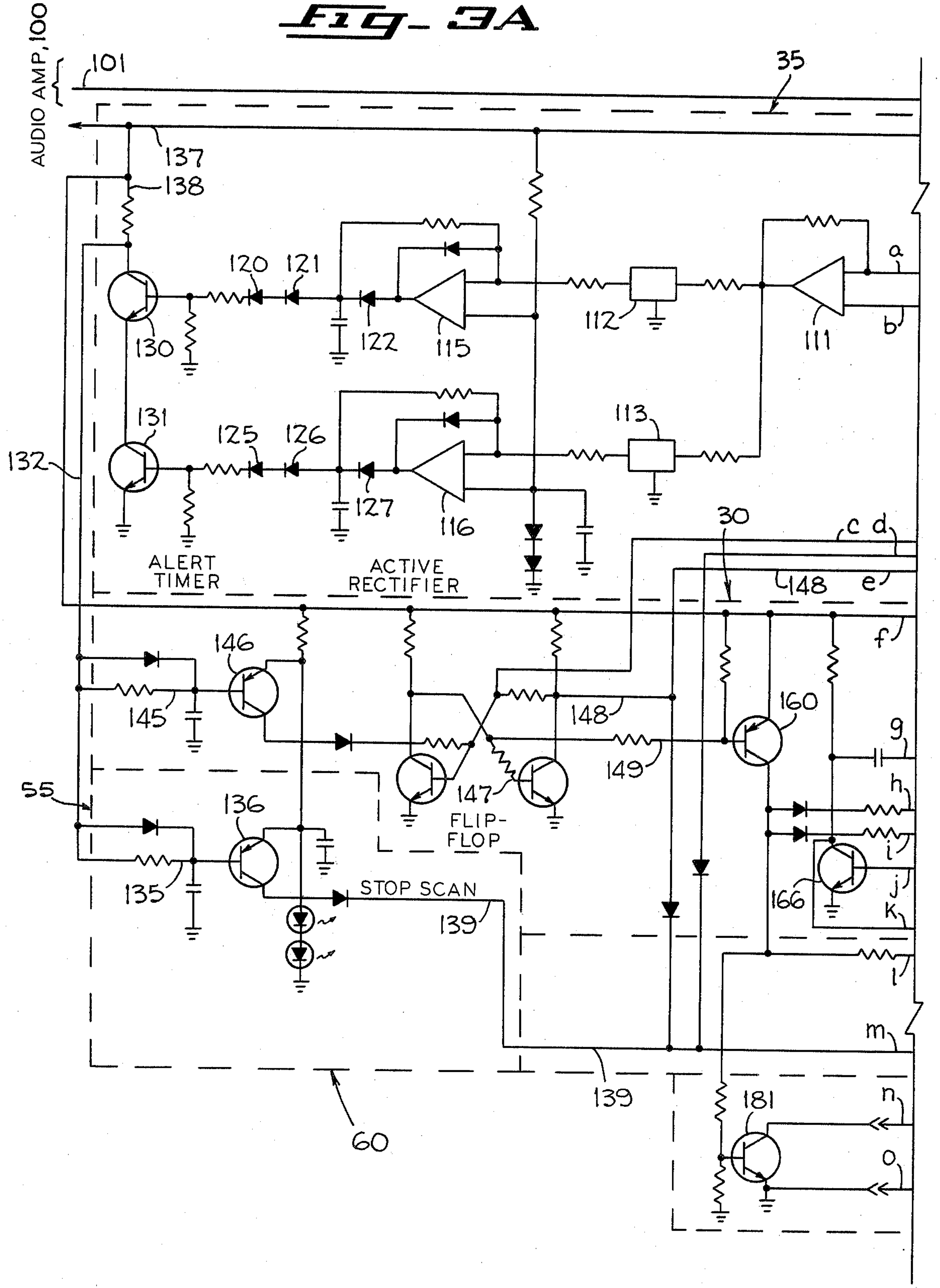
FIGS. 3A and 3B, when placed side-by-side, are a schematic diagram of a tone decoder, scanning circuit, and time delay circuits of the receiver shown in FIG. 1.
Figure 3B:
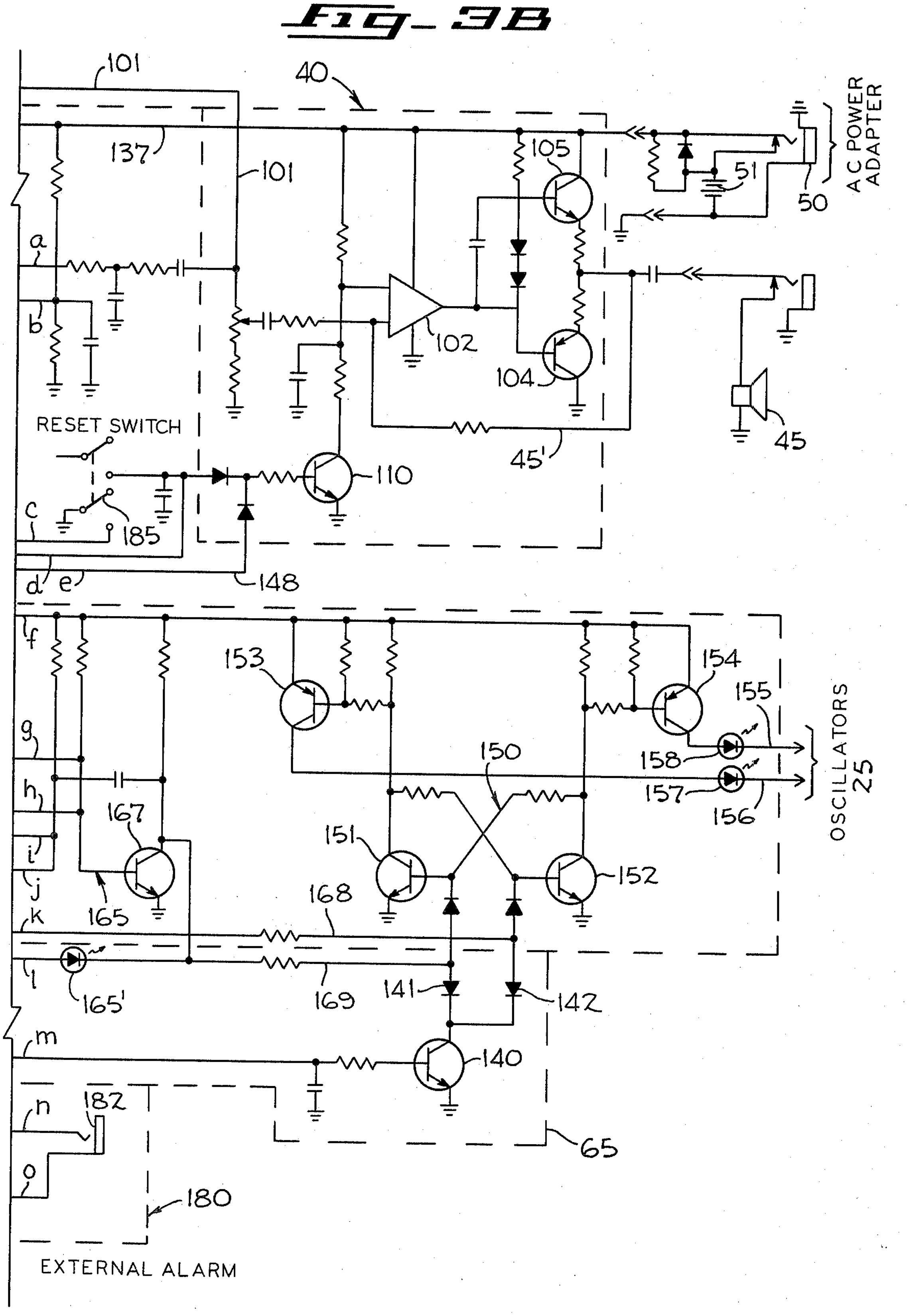

Connected to the output of the audio amplifier 100 over the conductor 101 is the two tone decoder 35 (FIG. 3A). The two tone decoder 35 comprises a suitable buffer amplifier 111. Connected to the output of the buffer amplifier 111 are suitable narrow band pass filters 112 and 113 of the two tone decoder 35. In the exemplary embodiment, the filters 112 and 113 are piezoelectric filters. In the preferred embodiment, the filter 112 passes only audio signals of the 960 $H_z$ frequency and the filter 113 passes only audio signals of the 853 $H_z$ frequency. A suitable amplifier 115 of the two tone decoder 35 is connected to the band pass filter 112 and a suitable amplifier 116 of the tone decoder 35 is connected to the band pass filter 113. The output of the amplifier 115 is rectified by drive detector diodes 120–122 of the tone decoder 35 to provide direct current drive voltages. In a like manner, the output of the amplifier 116 is rectified by drive detector diodes 125–127 to provide direct current drive voltages. The buffer amplifier 115 is arranged to limit significant overdrives in input level.

Included in the two tone decoder 35 are switching transistors 130 and 131. The switching transistors 130 and 131 are normally off or non-conducting. A drive voltage of sufficient magnitude in the output of the drive detector diodes 120–122 will enable or prepare the switching transistor 130 to conduct. Similarly, a drive voltage of sufficient magnitude in the output of the drive detector diodes 125–127 will enable or prepare the switching transistor 131 to conduct. The switching transistors 130 and 131 are connected in series and will only conduct simultaneously in response to the drive voltages from the 960 $H_z$ signal and the 853 $H_z$ being present at the same time of sufficient magnitude to turn-on the respective switching transistors 130 and 131.

The ten second time delay circuit 55 and the one second time delay circuit 60 are connected to the output of the tone decoder 35 over a conductor 132. The one second time delay circuit 60 includes a resistance-capacitance timing network 135 and a switching transistor 136. The switching transistor 136 is normally non-conducting through the high voltage applied to the base electrode thereof over the conductor 132, a conductor 138 and a high voltage conductor 137. When either of the switching transistors 130 and 131 is off or non-conducting, the voltage applied to the base electrode of the switching transistor 136 is high and the switching transistor 136 is off or non-conducting. When the switching transistors 130 and 131 are conducting simultaneously, the voltage on the collector electrode of the switching transistor 130 goes low. Should the attention frequency signal detected by the filters 112 and 113 continue for at least one second, the voltage applied to the base electrode of the switching transistor 136 through the resistance-capacitance timing network 135 will be reduced in magnitude sufficiently to turn-on the sswitching transistor 136. Thereupon, a stop scanning signal will be applied to the rectifier and amplifier circuit 65 over a conductor 139.

Included in the rectifier and amplifier circuit 65 (FIG. 3B) are a transistor amplifier 140 and rectifiers 141 and 142. In the absence of a stop scanning signal from the one second time delay circuit 60, the transistor amplifier 140 does not conduct and the scanning circuit 30 continues to operate for sequentially operating the oscillator means 25. It is a flip-flop circuit 150 in the scanning circuit 30 that continuously changes its state through the flip-flop action thereof to sequentially and continuously operate the oscillator means 25. The flip-flop circuit 150 is a conventional and well-known free running or astable multivibrator.

When a stop scan signal is present from the one second time delay circuit 60 over the conductor 139, the transistor amplifier 140 conducts. Hence, the output voltage at the collector electrode of the transistor 140 is low or at ground potential. As a consequence thereof, the flip-flop circuit 150 does not change its state, but is held at the existing state at the time of the application of the stop scan signal over the conductor 139. The receiver stages 20 are thereupon locked-in to the first carrier detected with an attention signal.

The ten second time delay circuit 55 (FIG. 3A) comprises a resistance-capacitance timing network 145, a switching transistor 146 and a flip-flop circuit 147. The switching transistor 146 is normally non-conducting through the high voltage applied to the base electrode thereof. When either of the switching transistors 130 and 131 is off or non-conducting, the voltage applied to the base electrode of the switching transistor 146 is high and the switching transistor 146 is off or non-conducting. When the switching transistors 130 and 131 are conducting simultaneously, the voltage on the collector electrode of the switching transistor 130 goes low. Should the attention signal detected by the filters 112 and 113 continue for at least ten seconds, the voltage applied to the base electrode of the switching transistor 146 through the resistance-capacitance network 145 will be reduced in magnitude sufficiently to turn-on the switching transistor 146. This action will change the state of the flip-flop circuit 147. The change of state of the flip-flop circuit 147 increases the voltage on a conductor 148 to a high voltage, such as +9 volts. Thereupon, the squelching transistor 110 (FIG. 3B) of the audio squelch circuit 40 has a low voltage on its collector electrode to enable the amplifier 102 of the squelch circuit 40 to conduct. As a consequence thereof, the power transistors 104 and 105 are turned on to operate the alarm 45.

The change of state of the flip-flop circuit 147 also reduces the voltage on the conductor 149 to cause a transistor 160 to conduct. The conduction of the transistor 160 activates an oscillator 165, which includes transistors 167 and 166. The transistor 166 is connected to the flip-flop circuit 150 of the scanning circuit 30 over a conductor 168 and the transistor 167 is connected to the flip-flop circuit 150 over a conductor 169. Connected to the output of the oscillator 165 is a flasher or light emitting diode 165'. When the transistor 160 conducts and dependent on the state of the flip-flop circuit 150, the light emitting diode 165' will flash.

The scanning circuit 30 (FIGS. 3A and 3B) comprise the flip-flop circuit 150 with the alternately conducting transistors 151 and 152. Connected to the output of the flip-flop circuit 150 are switching transistors 153 and 154. The switching transistor 153 conducts while the transistor 151 conducts and the switching transistor 154 conducts while the transistor 152 conducts. Thus, the switching transistors 153 and 154 are alternately conducting.

While the transistor 153 conducts, its collector electrode is at a high voltage, which in the exemplary embodiment, is 9 volts. Similarly, while the transistor 154 conducts its collector is at a high voltage, which, in the exemplary embodiment, is 9 volts. The output of the transistor 153 is connected to a light emitting diode 157 and the output of the transistor 154 is connected to a light emitting diode 158. When the diode 157 conducts over a path including a conductor 156, a low impedance path is provided to produce an oscillating frequency preselected by the crystal 86 (FIG. 2A). When the diode 158 conducts over a path including a conductor 157, a low impedance is provided to produce another oscillating frequency preselected by the crystal 85 (FIG. 2A). The oscillators means 25 operate continuously and sequentially to produce a plurality of oscillating frequencies. The light emitting diodes 157 and 158 show which channel is in use. High impedance paths for the crystals 85 and 86, respectively, prevents the excitation of the crystal in the high impedance path.

When the amplifier 140 (FIG. 3B) of the rectifier and amplifier circuit 65 under the control of the one second time delay circuit 60 has a low voltage on its collector electrode to produce a stop scanning signal, the flip-flop circuit 150 of the scanning circuit 30 is held in the state thereof present at the time the stop scan signal is produced to lock the receiver stages 20 to the carrier first detected with the attention signal.

Connected to the output of the transistor amplifier 160 is an alert external alarm circuit 180 (FIGS. 3A and 3B). When the transistor amplifier 160 is non-conducting, an alert signal is applied to the base electrode of a switching transistor 181 of the external alarm circuit 180. This action turns the switching transistor 181 on to operate an alert relay, not shown, through contacts 182. The energization of the alert relay operates an alert alarm.

The alarm 45 continues to operate until the circuit 10 is reset by a reset switch 185. The actuation of the reset switch 185 returns the squelching transistor 110 to its non-conducting state. Thereupon, the amplifier 102 does not conduct and the power transistors 104 and 105 are once again off to mute the alarm 45. The closing of the reset switch 185 also resets the flip-flop circuit 147 to its initial state. This action turns off the oscillator 165 and the external alarm 180. Since an alert audio signal is no longer in progress, the stop scan signal on the conductor 139 is removed and the scanning circuit 30 once again operates the oscillator means 25 for continuous and sequential operations.

We claim:

1. An attention receiver for use in emergency broadcast systems comprising:

(a) first means for picking up radio frequency signals each having a carrier modulated by an attention signal;

(b) second means including a first detector for receiving said radio frequency signals;

(c) oscillating means applying different respective oscillating frequencies to said first detector for producing an intermediate frequency signal modulated by an attention signal;

(d) a scanning circuit connected to said oscillating means to control the operation thereof to produce continuously and sequentially different respective oscillating frequencies;

(e) a second detector connected to said second means for producing an attention audio signal from said intermediate frequency signal modulated by the attention signal;

(f) alert means for alerting an operator;

(g) circuit connected to said second detector for operating said alert means in response to receiving said attention audio signal;

(h) a tone decoder connected to said second detector for detecting said attention audio signal;

(i) third means including a first time delay circuit connected to said tone decoder and said scanning circuit, said third means applying a stop scan signal to said scanning circuit in response to detection of said attention audio signal by said tone decoder for a period of time in excess of a first predetermined period of time to lock in said second means for reception of one of said attention signal modulated carrier signals and (j) fourth means including a second time delay circuit connected to said circuit for inhibiting said circuit from operating said alert means, said fourth means being connected to said tone decoder, said fourth means enabling said circuit to operate said alert means in response to receiving said attention audio signal from said tone decoder for a period of time in excess of a second predetermined period of time, said second predetermined period of time being greater than said first predetermined period of time.

2. An attention receiver as claimed in claim 1 wherein said attention signal comprises a plurality of audio frequency signals and said tone decoder includes a band pass filter for each of said audio frequency signals.

3. An attention receiver as claimed in claim 1 wherein said attention signal comprises at least two audio frequency signals and said tone decoder is a dual tone decoder with a band pass filter for each of said audio frequency signals.

4. An attention receiver as claimed in claim 3 wherein one of said audio frequency signals is a 960 $H_z$ signal and another of said audio frequency signals is a 853 $H_z$ signal.

5. An attention receiver as claimed in claim 1 wherein said alert means is muted by said circuit in response to said circuit being inhibited by said fourth means and said alert means producing an audio attention sound in response to said circuit being enabled by said fourth means.

6. An attention receiver as claimed in claim 2 wherein said alert means is muted by said circuit being inhibited by said fourth means and said alert means producing a multi-tone sound in response to said circuit being enabled by said fourth means.

7. An attention receiver for use in emergency broadcast systems comprising:

(a) first means for picking up radio frequency signals each having a carrier modulated by an attention signal;

(b) second means including a first detector for receiving said radio frequency signals;

(c) oscillating means applying different respective oscillating frequencies to said first detector for producing an intermediate frequency signal modulated by an attention signal;

(d) a scanning circuit connected to said oscillating means to control the operation thereof to produce continuously and sequentially different respective oscillating frequencies;

(e) a second detector connected to said second means for producing an attention audio signal from said intermediate frequency signal modulated by the attention signal;

(f) alert means for alerting an operator;

(g) a circuit connected to said second detector for operating said alert means in response to receiving said attention audio signal;

(h) a tone decoder connected to said second detector for detecting said attention audio signal; and (i) third means including a time delay circuit connected to said tone decoder and said scanning circuit, said third means applying a stop scan signal to said scanning circuit in response to detection of said attention audio signal by said tone decoder for a period of time in excess of a predetermined period of time to lock in said second means for reception of one of said attention signal modulated carrier signals.

8. An attention receiver as claimed in claim 7 wherein said attention signal comprises a plurality of audio frequency signals and said tone decoder includes a band pass filter for each of said audio frequency signals.

9. An attention receiver as claimed in claim 7 wherein said attention signal comprises at least two audio frequency signals and said tone decoder is a dual tone decoder with a band pass filter for each of said audio frequency signals.

10. An attention receiver as claimed in claim 9 wherein one of said audio frequency signals is a 960 $H_z$ signal and another of said audio frequency signals is a 853 $H_z$ signal.

11. An attention receiver as claimed in claim 1 and comprising an external alarm circuit connected to said fourth means for operating an alarm in response to said fourth means receiving said attention audio signal from said tone decoder for a period of time in excess of said second predetermined period of time.

12. An attention receiver as claimed in claim 1 and comprising a circuit connected to said fourth means and said scanning circuit for flashing a signal in response to said fourth means receiving said attention audio signal from said tone decoder for a period of time in excess of said second predetermined period of time.

* * * * *